United States Patent [19]

Reeds

[11] Patent Number: 4,891,526
[45] Date of Patent: Jan. 2, 1990

[54] X-Y-θ-Z POSITIONING STAGE

[75] Inventor: John W. Reeds, Thousand Oaks, Calif.

[73] Assignee: Hughes Aircraft Company, Los Angeles, Calif.

[21] Appl. No.: 300,150

[22] Filed: Jan. 19, 1989

Related U.S. Application Data

[63] Continuation of Ser. No. 218,521, Jul. 5, 1988, abandoned, which is a continuation-in-part of Ser. No. 947,201, Dec. 29, 1986, abandoned.

[51] Int. Cl.$^4$ .................. H10J 37/20; G01B 11/00
[52] U.S. Cl. .................. 250/442.1; 356/401; 250/492.2
[58] Field of Search .................. 250/492.2

[56] References Cited

U.S. PATENT DOCUMENTS

| | | | |
|---|---|---|---|
| 3,648,048 | 3/1972 | Cahan et al. | 250/442.1 |
| 3,791,739 | 2/1974 | Kawasaki | 350/363 |
| 3,838,274 | 9/1974 | Doubek, Jr. et al. | 250/201 |
| 4,170,418 | 10/1979 | Aiuchi et al. | 356/400 |
| 4,203,064 | 5/1980 | Suzuki et al. | 318/640 |
| 4,218,136 | 8/1980 | Konoriya et al. | 355/79 |
| 4,516,029 | 5/1985 | Tucker | 250/442.1 |
| 4,528,490 | 7/1985 | Hansen | 318/560 |
| 4,585,337 | 4/1986 | Phillips | 355/45 |
| 4,627,009 | 12/1986 | Holmes et al. | 364/559 |
| 4,676,649 | 6/1987 | Phillips | 356/401 |

FOREIGN PATENT DOCUMENTS

| | | | |
|---|---|---|---|
| 0027570 | 4/1981 | European Pat. Off. | |
| 0091234 | 10/1983 | European Pat. Off. | |
| 0220554 | 5/1987 | European Pat. Off. | 356/363 |
| 1602768 | 3/1971 | France | |
| 8500075 | 1/1985 | PCT Int'l Appl. | |

OTHER PUBLICATIONS

R. H. Keen et al., "Photosensitive System for Orienting a Translucent Substrate", Technical Digest, No. 21, Western Electric, Jan. 1971, pp. 17–19.

T. Uchiyama et al., "A Precision Auto Mask Aligner", Fujitsu Scientific & Technical Journal, vol. 15, No. 4, Dec. 1979 (Tokyo, Japan), pp. 77–94.

Primary Examiner—Janice A. Howell
Assistant Examiner—John A. Miller
Attorney, Agent, or Firm—V. D. Duraiswamy; P. M. Coble; W. K. Denson-Low

[57] ABSTRACT

A positioning stage is disclosed which achieves high-speed step-and-repeat alignment of a semiconductor wafer to a mask with a full six degrees of freedom. A precision planar translational stage is mounted on a rotating stage to allow a single-laser interferometric system to be utilized to make precise measurements of translational (X and Y) and rotational (θ) positions. The entire X-Y-θ stage system can also be moved vertically in a Z direction, or tilted with respect to the X-Y plane, by independently adjustable flexible mounts. The center of rotation of the rotational stage is on the beam axis, so that registration of the wafer to a mask is simplified. Because the mass of the rotating stage is not moved during high-speed X- and Y-positioning steps, fast response is possible. In lithography applications, one rotational correction at the beginning of the writing procedure suffices for all the chips on the wafer, if all the rows and columns of chips are perfectly straight. Besides its usefulness in lithography with a flood ion beam, the invention is also useful in direct-write electron- or ion-beam lithography systems with focused beams, to obviate the need for high-speed electronic scan rotation.

30 Claims, 10 Drawing Sheets

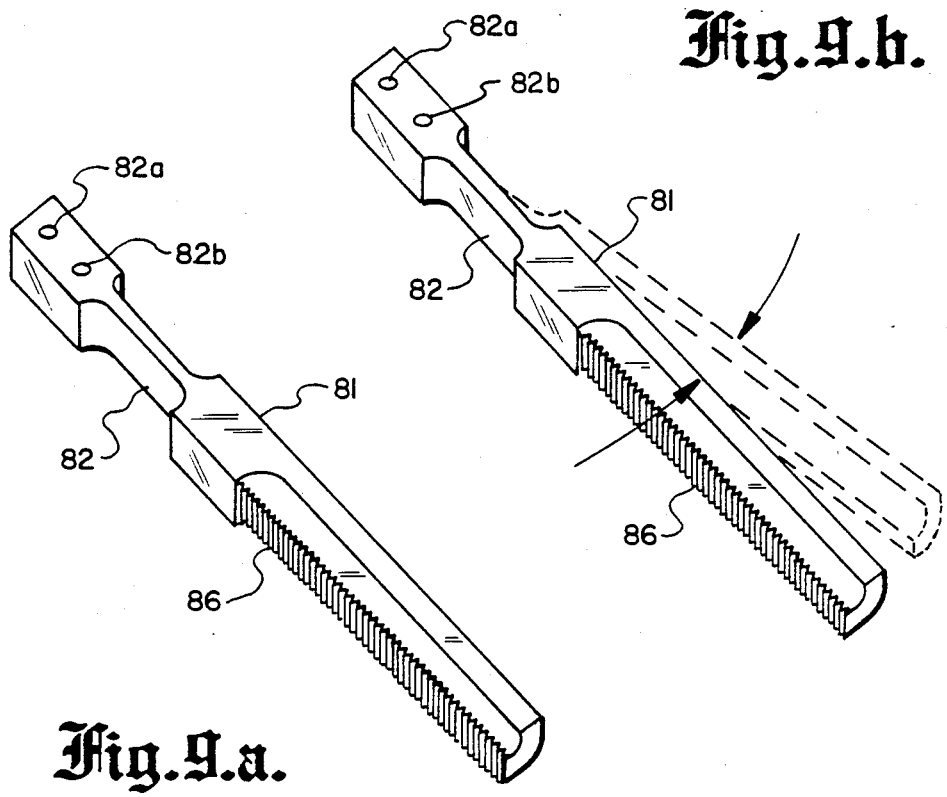
Fig.9.a.
Fig.9.b.
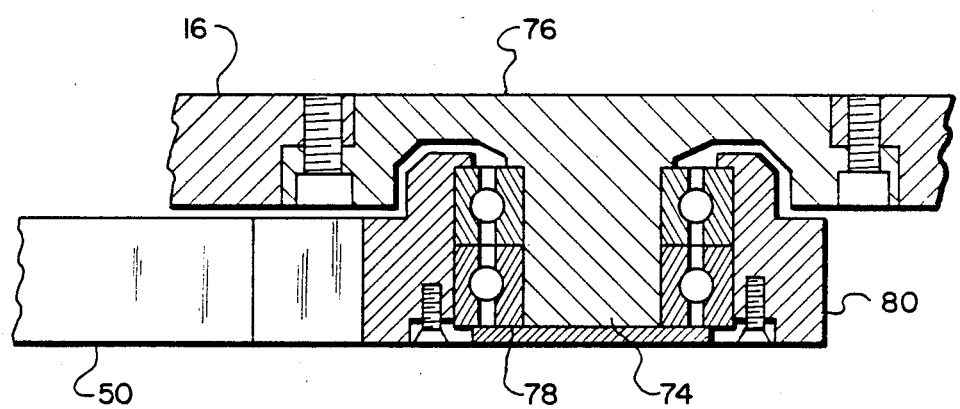
Fig.8.

X-Y-θ-Z POSITIONING STAGE

This application is a continuation of application Ser. No. 218,521, filed July 5, 1988, now abandoned, which was a continuation-in-part application of Ser. No. 947,201, filed Dec. 29, 1986, now abandoned.

BACKGROUND OF THE INVENTION

1. Field of the Invention

The present invention pertains to apparatus for positioning an object precisely with at least four and as many as six degrees of freedom, and in particular to a positioning stage for use in masked ion-beam lithography.

2. Description of the Related Art

The design and production of very large scale integrated (VLSI) circuitry components requires an assortment of costly apparatus and sophisticated processing techniques. Lithography is the process bringing together the many techniques for selectively removing or adding material to the semiconductor wafers from which the circuit chips are ultimately fabricated. One of the most promising techniques in this area of technology is masked ion-beam lithography, in which a collimated beam of ions passes through a mask onto a semiconductor wafer covered with photoresistive material. The advantage of using ion-beam lithography is that it allows extremely high pattern resolution. The massive ions have a relatively short mean free path in the photoresist material, and the secondary electrons produced in collisions have relatively low energy and also do not travel very far. Because there is some ion scattering when the ions travel through the mask, the mask and wafer must be positioned very closely to each other (approximately 25 micrometers) to achieve high-resolution exposures.

Once the mask is fixed in location, alignment of the wafer to the mask requires precise motions with at least four and as many as six degrees of freedom. The movements need to be accomplished very rapidly, and the wafer needs to be held rigidly in place once it is precisely located.

Hansen U.S. Pat. No. 4,528,490, assigned to Hughes Aircraft Company, the assignee of the present invention, discloses a two-axis drive for a positioning stage. The drive includes, for each stage, a drive bar frictionally engaged against a drive capstan and held in place by a floating pressure roller so that the pressure roller can swing as the drive bar swings.

Reeds U.S. Pat. No. 4,532,426, assigned to Hughes Aircraft Company, discloses a wafer height correction system for a focused beam system. The base plate of the wafer support is flexibly mounted with respect to the floor of the target chamber. Metal diaphragms flex by operation of one or more motors to adjust the position of the wafer support with respect to the focal point of the column.

Typical positioning apparatuses used for wafer lithography incorporate a rotating stage on top of a translational stage. Translational motion of the wafer in a plane and rotation of the wafer about an axis normal to that plane are allowed. The plane of translational motion is commonly referred to as the X-Y plane, and the angle of rotation in the X-Y plane as $\theta$. With this sort of arrangement, the mass of the rotating element must be moved in changing the X and Y positions of the wafer. The added inertia of the rotating stage reduces the speed of response that is obtainable. In addition, with this sort of arrangement, as the X and Y positions are varied, the center of rotation for $\theta$ moves relative to the system axis. In registering the lithography mask to the wafer, if the center of rotation does not lie on the system beam axis, then each chip on the wafer will require a different algorithm to use the mask-mask alignment sensing measurements to compute the necessary rotational corrections to align the mask and the wafer. Also, in conventional positioning systems the wafer is not fixed relative to the interferometer mirrors used in determining the position of the wafer. This makes the procedure of measuring the X-Y position of the wafer more complicated than it would be if the position of the wafer were fixed relative to the interferometer mirrors.

In conventional direct-write systems using a focused electron or ion beam to create the patterns on a chip, the center of rotation for the positioning stage does not coincide with the beam axis The pattern to be written on the chip is programmed in X-Y coordinates on a computer which controls the scanning of the beam. Any rotational misalignment that is compensated for by rotating the wafer creates an X-Y shift of each chip that varies with the position of the chip on the wafer. The X-Y coordinates must now be transformed for each chip to take account of the rotation.

SUMMARY OF THE INVENTION

It is an object of the present invention to provide apparatus for the precise positioning of an object in three dimensions, including three translational degrees of freedom and three angular degrees of freedom.

It is another object of the present invention to provide a positioning stage for masked ion-beam lithography, which allows translational movement of a semiconductor wafer in three mutually perpendicular directions, as well as rotational movement about three mutually perpendicular axes of rotation.

It is yet another object of the present invention to provide a positioning apparatus that avoids the necessity for high-speed electronic scan rotation in electron- and ion-beam direct-write systems.

It is still another object of the present invention to provide a positioning apparatus for use in wafer lithography in which the center of rotation for the rotating stage does not move relative to the beam axis.

Another object of the present invention is to provide a positioning stage for wafer lithography in which the mass of a rotating stage does not have to be moved during highspeed translational positioning steps, so that faster response is achieved.

One more object of the present invention is to provide a precision lithography positioning stage in which the object to be positioned is fixed relative to interferometer mirrors used for measuring the object's position.

Finally, it is an object of the present invention to provide a lithography positioning stage in which rotation of a semiconductor wafer can be done about the beam axis, independent of the wafer's position in a plane, so that the process of registering the wafer to the mask is simplified.

The invention provides means of achieving high-speed step-and-repeat alignment of a semiconductor wafer to a mask with a full six degrees of freedom. The apparatus disclosed consists of a precision planar translational stage mounted on a rotating stage in a manner that allows a single-laser interferometric system to be utilized to make precise measurements of translational (X and Y) and rotational (θ) positions. The entire X-Y-θ stage system can also be moved vertically in a Z direction, or tilted slightly with respect to the X-Y plane, by independent Z drives, so that a full six degrees of freedom in positioning a sample with high precision can be achieved Because the mass of the rotating stage is not moved during high-speed X- and Y-positioning steps, fast response is possible The center of rotation for θ is on the beam axis and does not move relative to it. In lithography applications, a semiconductor wafer can be rotated about the beam axis independent of the X and Y positions, and registration of the wafer to the mask is simplified. One rotational correction at the beginning of the writing procedure suffices for all the chips on the wafer, if all the rows and columns of chips are perfectly straight. In general, however, very small corrections in position may be necessary for each chip exposure.

The invention fills the need for a rigidly coupled, fast-responding positioning apparatus that can be conveniently used in VLSI circuit chip lithography and related work. The disclosed apparatus allows the precise positioning of a semiconductor wafer in as many degrees of freedom as possible, in order to facilitate the alignment of a lithography mask to the wafer. In contrast to the prior art, the center of rotation of the rotational stage is on the beam axis, and does not require the mass of the rotating stage to be moved during translational positioning movements. The position of the wafer is fixed with respect to the interferometer mirrors used in measuring its position. Besides its usefulness in lithography with a flood ion beam, the invention is also useful in directwrite electron- or ion-beam lithography systems with focused beams, to obviate the need for high-speed electronic scan rotation.

An appreciation of other aims and objects of the invention and a more complete understanding of it may be achieved by studying the description of the preferred embodiment and by referring to the accompanying drawings.

BRIEF DESCRIPTION OF THE DRAWINGS

FIG. 8 is a sectional view, with parts broken away, of the Y drive bar attachment to the X-Y stage plate.

FIG. 9a is a perspective view of the θ drive bar.

FIG. 9b is another perspective view of the θ drive bar showing how its flexure allows the angle θ to change.

DESCRIPTION OF A PREFERRED EMBODIMENT

Figure 1:
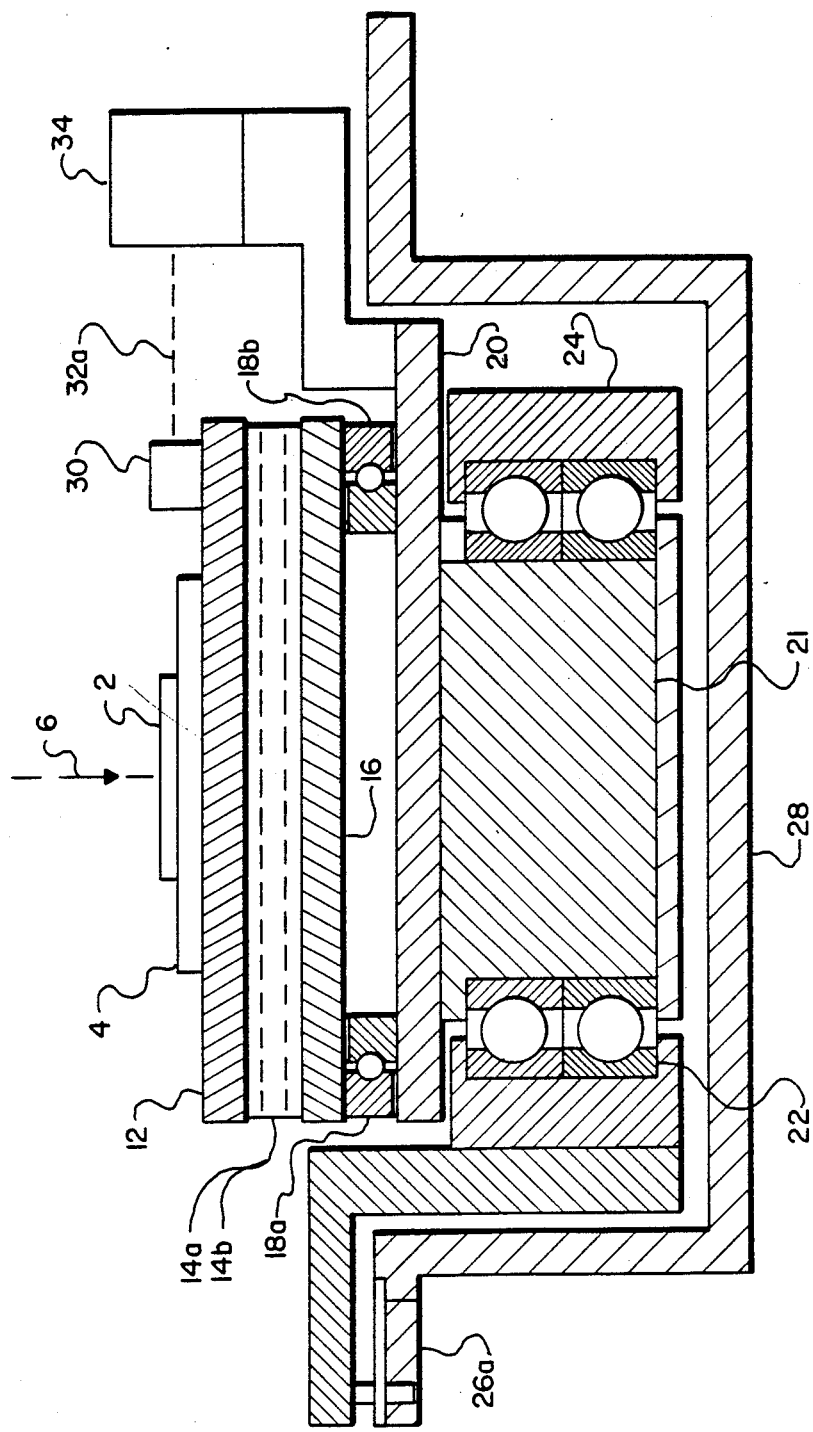
FIG. 1 is sectional view of the apparatus of the present invention.
Figure 2:
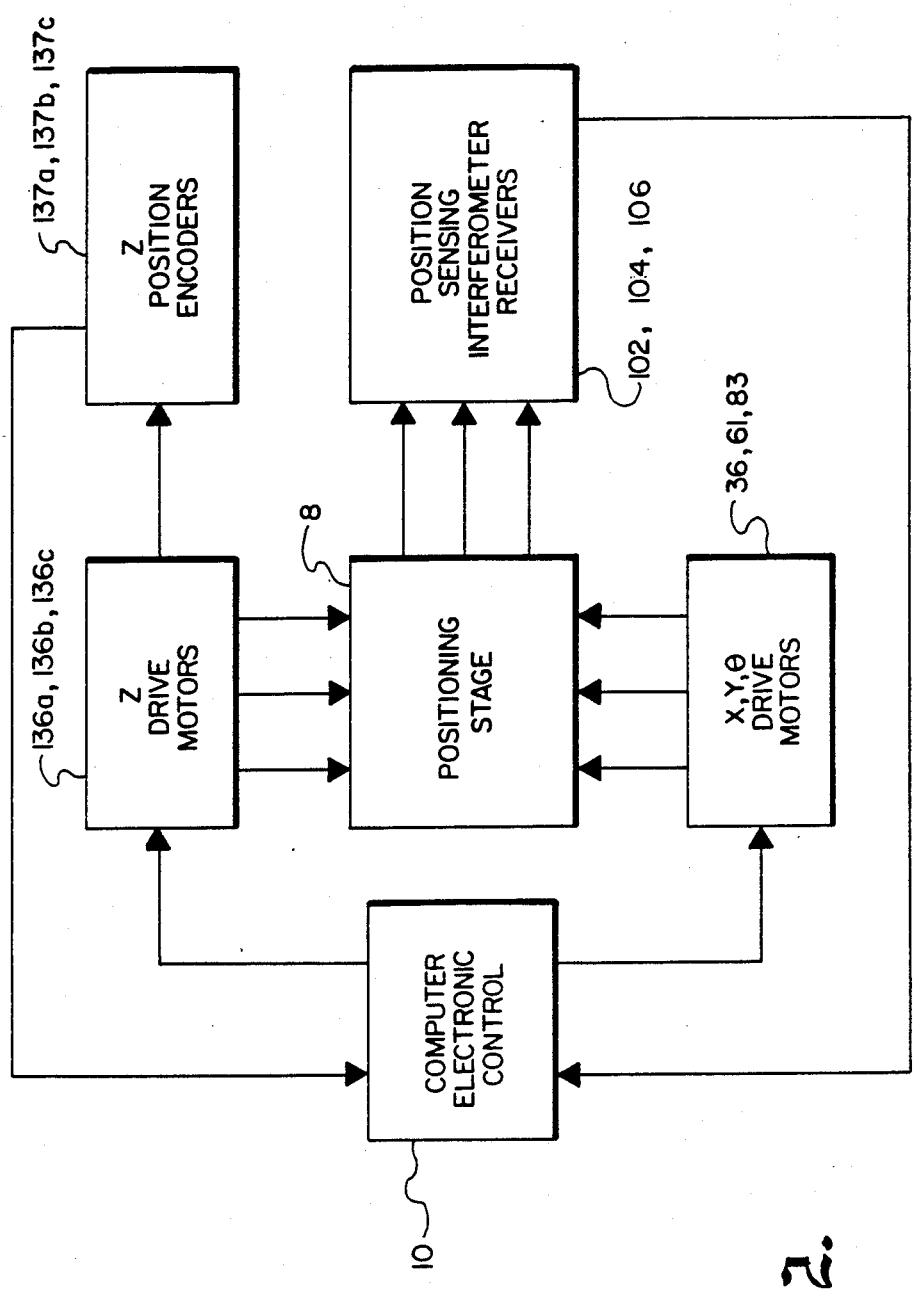
FIG. 2 is a schematic block diagram of the electronic control arrangement for the positioning stage.

FIG. 1 illustrates a semiconductor wafer 2 mounted conventionally on a mounting block 4 with a collimated ion beam impinging on it along a beam axis 6. The apparatus shown is in a vacuum. The wafer must be accurately positioned and regularly repositioned for treatment by the ion beam. Therefore, the positioning stage 8 of the present invention carries the wafer 2, and (referring to FIG. 2) electronic control means 10 is connected to drive the positioning stage 8 and position it with respect to the ion beam. The electronic control means 10 is preferably in the form of a computer having a program to establish the desired position of the wafer 2.

In the sectional view of FIG. 1, some of the details of the positioning stage 8 can be seen. An X-Y stage plate 12 which is the top portion of stage 8 is mounted on first and second X translation linear bearings 14a,14b. A typical linear bearing consists of a line of balls mounted in a retainer which maintains the spacing between the balls, and positioned between two "V"-shaped notches in which the ball surfaces roll during rectilinear motion. The first and second linear bearings 14a,14b are spaced apart and aligned in the X direction. Bearings 14a,14b in turn are mounted on an intermediate plate 16 that is mounted and rides on first and second Y translation linear bearings 18a,18b. The entire X-Y stage, comprising X-Y stage plate 12, X translation bearings 14a,14b, intermediate stage plate 16, and Y translation bearings 18a,18b, is mounted on a θ rotation stage platform 20. Platform 20 is mounted on the end of a rotor drum 21 set inside rotation bearings 22, which in turn are set inside a stator 24. Bearings 22 are a duplexed pair of nonseparable ball bearings which are preloaded to maintain an interference fit for the balls. Three vertically adjustable flexible mounts 26a,26b,26c (only one is shown in FIG. 1) are secured to a base 28 to support stator 24. An X position mirror 30 is mounted on the X-Y stage plate 12 to reflect the beam 32a from an X interferometer 34, which is used to sense the position of the wafer 2 along the X translational axis.

Intermediate stage plate 16 is constrained to move into and out of the page (the Y direction) in FIG. 1 in a linear direction with respect to θ stage platform 20. Stage plate 16 moves on first and second spaced Y translation linear bearings 18a,18b. The pair of spaced X translation bearings 14a,14b constrain the X-Y stage plate 12 to move left or right (the X direction) in FIG. 1 with respect to the intermediate stage plate 16. The X translation bearings 14a,14b are arranged so that the X-Y stage plate 12 moves along an axis parallel to the direction of the bearings 14a,14b, which are substantially parallel to each other and to the surface of X-Y stage plate 12. Wafer 2 is positioned on mounting block 4 on stage plate 12 and is substantially normal to the ion beam axis 6. Similarly, the Y translation linear bearings 18a,18b are arranged so that the intermediate stage plate 16 moves along an axis parallel to the direction of the bearings' alignment. The bearings are substantially parallel to each other and to the top surface of intermediate stage plate 16.

The X-Y stage plate 12, the intermediate stage plate 16, and the θ stage platform 20 are each driven by separate drive mechanisms which are very similar. The drive mechanism for the intermediate stage plate 16 is shown in more detail in FIG. 7 as representative of all three drive mechanisms. A Y-drive motor 36 is mounted on a flange 38 which is secured to the bottom of base 28. A collar 40 extends upward from flange 38 and contains strong and heavy antifriction bearings 42. A Y drive capstan 44 with a Y drive pinion gear 46 mounted on it is driven by Y drive motor 36 and is supported by bearings 42. A seal 43 is positioned around the capstan within flange 38 so that the Y drive motor 36 may be in the nonvacuum space. There is a vacuum above the base 28. The seal 43 may be a Ferro-Fluidic seal.

Figure 7:
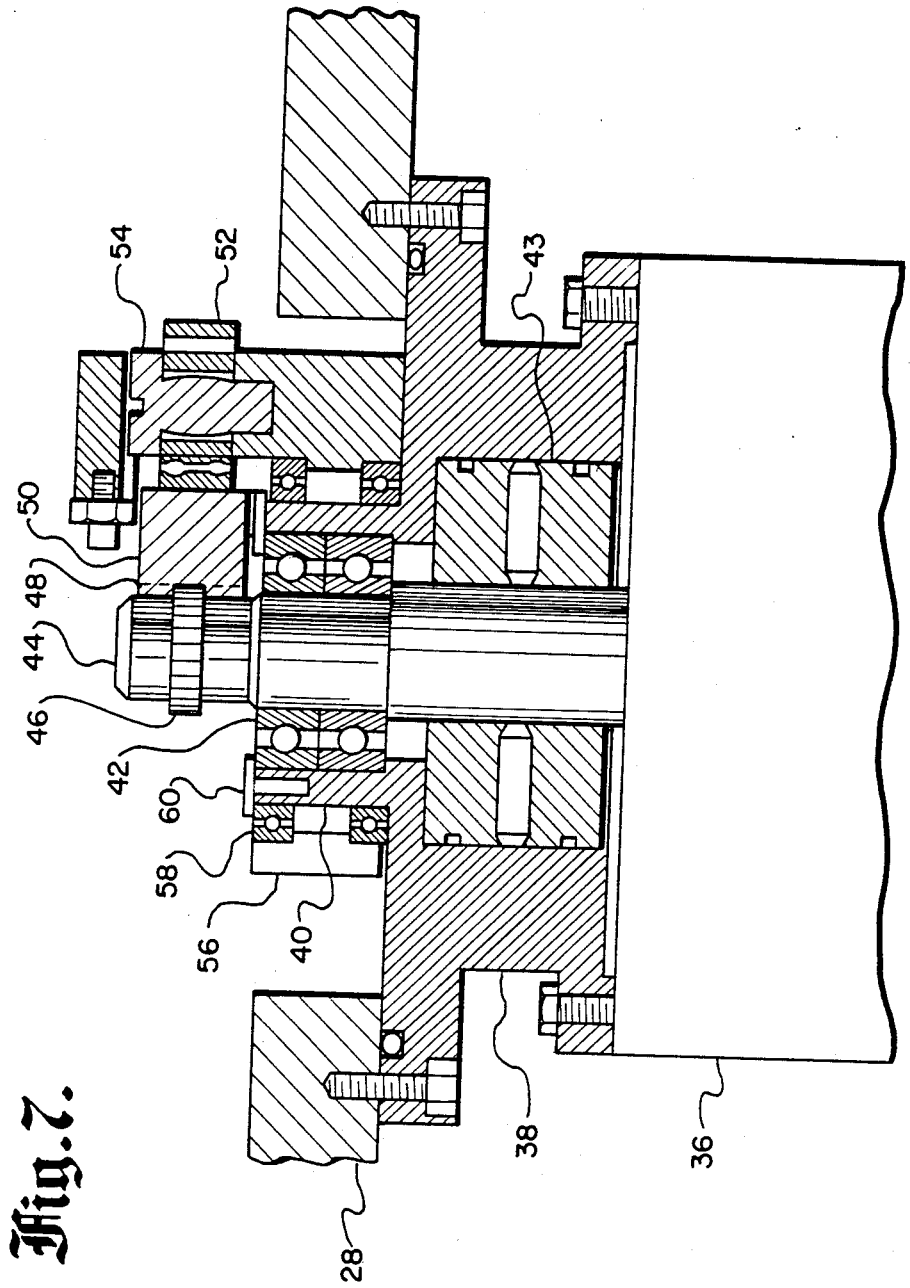
FIG. 7 is a sectional view, with parts broken away, showing the capstan engagement with the drive bar, and the pressure roller mounting.

A Y drive rack gear 48 on a Y drive bar 50 is engaged with pinion gear 46 on Y drive capstan 44. Y drive pressure rollers 52,53 engage the side of the Y drive bar 50 opposite Y drive capstan 44 to apply a normal force which keeps Y drive rack gear 48 meshed with Y drive pinion gear 46. The mounting of both Y drive pressure rollers 52,53 is the same. As seen in FIG. 7, Y drive pressure roller 52 is in the form of a needle type antifriction bearing mounted on a pin 54. Pin 54 is mounted on a Y drive yoke 56, and may be barrel shaped to permit tilting of pressure roller 52. Y drive yoke 56 is in turn mounted on antifriction bearings 58 which embrace the outer surface of collar 40. An annular cap 60 keeps bearings 42 and 58 in place. The axis of rotation of Y drive yoke 56 coincides with the axis of rotation of Y drive capstan 44, so that the pressure rollers 52,53 can swing around the capstan. The yoke structure is preloaded to maintain pressure on Y drive bar 50 to hold Y drive rack gear 48 in engagement with Y drive pinion gear 46 on Y drive capstan 44, independent of the direction of Y drive bar 50 around the axis of the capstan. With this construction, the direction of motion of the intermediate stage plate 16 on its Y translation bearings 18 need not be exactly parallel to the direction of motion of the Y drive bar 50 as driven by Y drive capstan 44.

Y drive motor 36 is connected to be appropriately driven to move the intermediate stage plate 16 into and out of the plane of FIG. 1. The direction of Y drive bar 50 has complete angular freedom in a plane normal to the Y drive capstan 44 and pin 54, which are substantially parallel to each other. In a similar way, an X drive motor 61 has an X drive capstan 62 with an X drive pinion gear 64 mounted on it. Pinion gear 64 engages a rack gear 66 on one side of the X drive bar 68. A pair of X drive pressure rollers 70,71 keep the gears meshed under pressure.

The attachment of the other end of the Y drive bar 50 to the intermediate stage plate 16 is illustrated in FIG. 8. A pin 74 is secured to and extends downward from the bottom of an insert 76, which is secured in an opening in intermediate stage plate 16. Bearings 78 embrace pin 74 and are constrained within a yoke 80, which is secured to the end of Y drive bar 50. The bearings 78 are a heavily preloaded duplex pair to eliminate backlash and provide a stiff connection. It is thus seen that Y drive bar 50 does not apply torques to intermediate stage plate 16. Y drive bar 50 has angular freedom of movement in a plane normal to the axis of Y drive capstan 44, because the drive end adjacent capstan 44 has such freedom and the yoke end under insert 76 has such freedom. It is particularly important to have the angular freedom for the drive bar 50, because its capstan end is referenced to the base 28 while its yoke end is referenced to the intermediate stage plate 16. Stage plate 16 has freedom of motion in the directions defined by the translation bearings 18a,18b and the rotation bearings 22.

Again in a way similar to that for the Y drive arrangement, a θ drive motor 83 has a θ drive capstan 88 with a θ drive pinion gear 86 mounted on it. Pinion gear 86 engages a rack gear 84 on one side of the θ drive bar 81. A pair of θ drive pressure rollers 87,89 which are mounted on an θ drive rotatable yoke keep the gears meshed under pressure.

The attachment of X drive bar 68 to stage plate 12 is similar to the attachment of Y drive bar 50 to intermediate plate 16 as described above and illustrated in FIG. 8. The attachment of the θ drive bar 81 to θ stage platform 20 is different from that for the X and Y drives, however. The θ drive bar is as shown in FIGS. 9a and 9b. Because the range of rotation in the angle θ is only a few degrees, the θ drive bar 81 has a narrowed section 82. The narrowed part allows it to flex slightly, as shown in FIG. 9b, as the θ stage platform 20 is rotated. The width of the θ drive bar 81 narrows from ¾ of an inch to about 1/10 of an inch; the narrowed portion 82 has a length of about one and a half inches. The thickness of the drive bar 81 is about half an inch. The end of drive bar 81 has two holes 82a,82b through which bolts fasten it to the θ stage platform 50.

Figure 3:
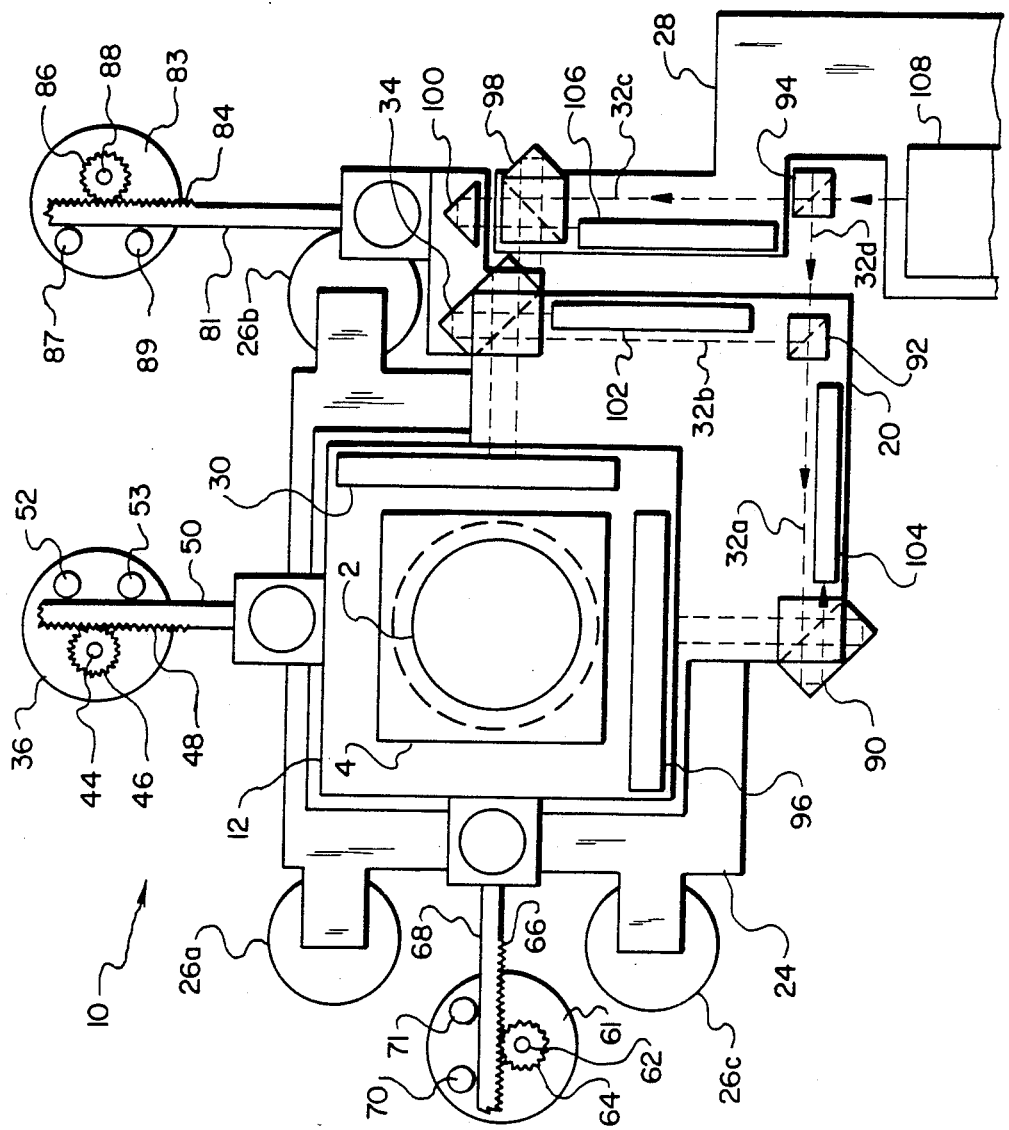
FIG. 3 is a modified plan view of the X-Y-θ-Z positioning stage used in the invention. Some component parts have been relocated to aid in understanding operation of the stage.

Referring now to FIG. 3, which is a plan view of the X-Y-θ-Z positioning stage 8, details are seen of how the stage 8 is driven and how the position of the wafer 2 is measured. X drive bar 68 with rack gear 66 on one side couples the X-Y stage plate 12 via meshing pinion gear 64 on X drive capstan 62 to X drive motor 61. Similarly, Y drive bar 50 with rack gear 48 on one side couples intermediate stage plate 16 via meshing pinion gear 46 on Y drive capstan 44 (shown in FIG. 4) to Y drive motor 36 (shown in FIG. 3). The θ drive bar 81 couples θ stage platform 20 to θ drive motor 83 (shown in FIG. 3) in a way similar to that for the X and Y drive couplings, through rack gear 84 meshed with pinion gear 86 on capstan 88. Three vertically adjustable flexible mounts 26a,26b,26c support the stator 24.

A Y interferometer 90 and Y receiver 104, an X interferometer 34 and X receiver 102, and a first beamsplitter 92 are all mounted on rotational stage platform 20. A second beamsplitter 94 is mounted separately and coupled to rotate through half the angle that the rotating stage does. The interferometer 90 is used in conjunction with a Y position mirror 96 mounted on the X-Y stage plate 12 to determine the Y position of the wafer being worked on. The X interferometer 34 is used in concert with the beamsplitters 92,94 and X position mirror 30 to determine the X position of the semiconductor wafer. A θ interferometer 98 mounted on base 28 is used cooperatively with the second beamsplitter 94 and a retroreflector 100 mounted on platform 20 to determine the θ angular position of the wafer. Laser receivers 102, 104, and 106 ultimately detect the three beams 32a,32b,32c derived from laser 108, also mounted on base 28, and sensed respectively by X interferometer 34, Y interferometer 90, and θ interferometer 98. The semiconductor wafer 2 to be worked on is mounted on mounting block 4 on top of the X-Y stage plate 12, which must be adjusted to be perpendicular to the ion beam axis 6.

Referring now to FIG. 3, laser beam 32d must remain perpendicular to the face of beamsplitter 92 as the platform 20 rotates in θ. Beamsplitter 94 is mechanically coupled to the θ stage platform 20 so that it rotates through only half the angle through which the θ stage platform 20 rotates. This is necessary because a beam reflected from a mirror rotates through twice the angle through which the mirror rotates. The mirrors 30 and 96 are used to reflect the X and Y interferometer beams, respectively. One possible arrangement for the half-angle mechanical coupling between the beamsplitter 94 and the θ stage platform 20 is shown in FIG. 10.

Figure 10:
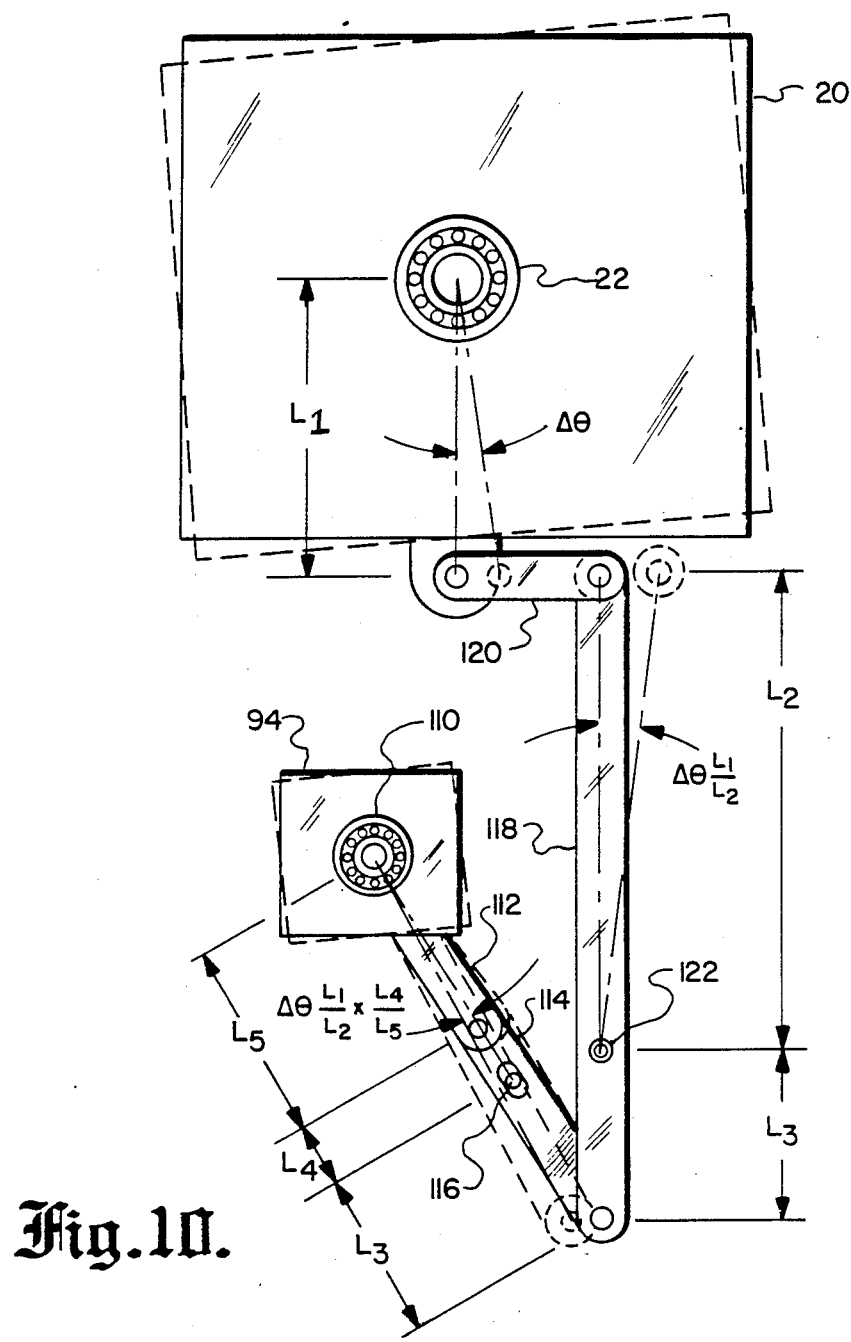
FIG. 10 is a plan view of a half-angle coupling arrangement that connects one of the beamsplitters to the θ stage platform.

In FIG. 10, the beamsplitter 94 is mounted on a rotation bearing 110 and is rigidly coupled to a first linkage arm 112 which is pivotally attached to one end of a second linkage arm 114. The distance from the center of the beamsplitter to the pivotal connection with the second linkage arm 114 is $L_5$. The second linkage arm 114 has a slot into which a first pivot pin 116 mounted on base 28 fits. A third arm 118 is pivotally connected to the other end of the second linkage arm 114 and to one end of a fourth linkage arm 120. The third arm 118 has a hole in it so that it can be pivotally mounted on a second pivot pin 122 which is rigidly attached to base 28. The distance from the pivot pin 122 to the pivotal connection point of the third linkage arm 118 with the fourth linkage arm 120 is $L_2$. The pivotal connection point of the second linkage arm 114 with third linkage arm 118 is equidistant from the two stationary pivot pins 116 and 122. The other end of fourth linkage arm 120 is pivotally attached to the θ stage platform 20 at a distance $L_1$ from the center of the stage. $L_4$ is the distance between (a) the pivotal connection of first linkage arm 112 with second linkage arm 114 and (b) first pin 116. The ratio $L_1L_4/L_2L_5$ is chosen to equal $\frac{1}{2}$, so that the beamsplitter 94 rotates through only half the angle through which the θ stage platform rotates.

The X interferometer 34, Y interferometer 90, retroreflector 100, and laser receivers 102,104 are all mounted on the θ stage platform 20. The θ interferometer 98, laser receiver 106, and laser 108 are mounted on the base 28. The X and Y interferometers can both be Hewlett-Packard Model 10706 interferometers, while the θ interferometer can be a Hewlett-Packard Model 10702A, Retroreflector 100 can be a Hewlett-Packard Model 10703A, and beamsplitters 92,94 can both be Hewlett-Packard Models 10701A. Laser receivers 102,104, and 106 can all be Hewlett-Packard Models 10780A, and laser 108 can be a Hewlett-Packard Model 5501.

The output beam from laser 108 is incident on first beamsplitter 94. Part of the incident beam is transmitted to θ interferometer 98 and the remainder is reflected to impinge on beamsplitter 92, which similarly divides the incident beam into a part reflected at right angles to X interferometer 34 and a residual transmitted beam which strikes Y interferometer 90.

The X, Y, and θ interferometers all work in essentially the same manner, except that the retroreflector 100 used with the θ interferometer 98 corresponds in its function roughly to the X position mirror 30 or the Y position mirror 96. The reason for using a corner cube reflector is that any beam reasonably close to normal incidence is reflected back parallel to itself, although with a slight lateral shift whose magnitude depends on the angular deviation from normality.

The beam leaving the laser at a nominal wavelength of 632.8 nm is actually composed of two differently polarized beams which differ by 20 MHz in frequency as a result of so-called Zeeman splitting of a transition line. The splitting of the line is effected by a magnetic field which permeates the active medium of the laser. Each interferometer comprises a polarizing beamsplitter in combination with an attached quarter-wave plate. Of the two differently polarized beams incident on the interferometer, only one traverses an optical path that includes reflection from the mirror or retroreflector. The motion of the reflecting element is converted, via the Doppler effect, into a frequency shift of the polarized beam reflected from it. The frequencies of the two differently polarized beams are fed to a difference counter. The number of counts in the difference is effectively a velocity multiplied by a time interval. The distance of travel of the reflector thus yields the distance of travel of the particular part of the stage to which it is attached. With the use of a phase lock oscillator at a frequency of ten times the Zeeman frequency shift, it is possible to resolve a change in position as small as 79 Angstroms for the position of the X or Y mirrors.

Figure 11:
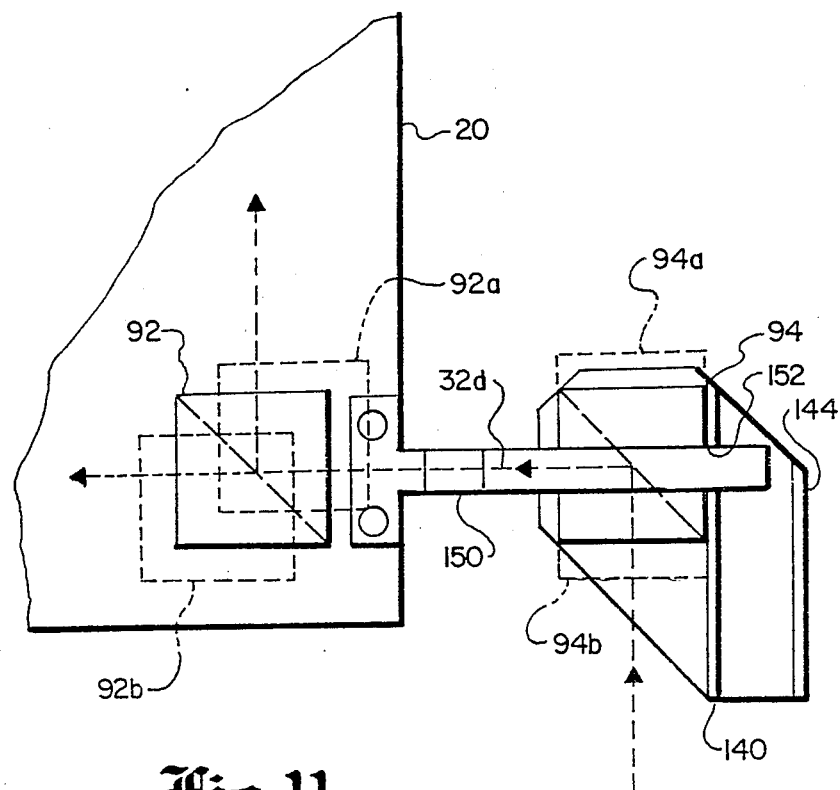
FIG. 11 is a fragmentary plan view showing the coupling between the θ stage platform and one of the beamsplitters.
Figure 12:
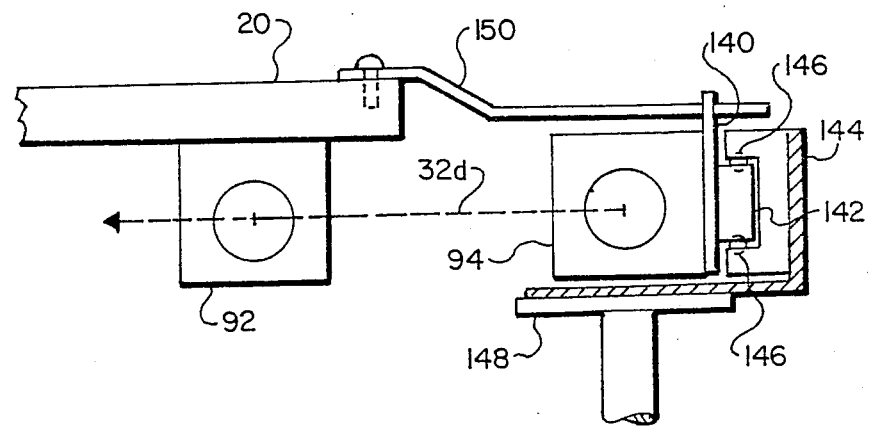
FIG. 12. is a partially sectioned elevational view of the coupling mechanism shown in FIG. 11.

Rotations of stage 20 beyond a certain point can result in the laser beam from beamsplitter 94 missing the beamsplitter 92. To avoid this possibility, a coupling mechanism is provided on the rotational stage platform which moves the beamsplitter 94 when platform 20 is rotated so as to keep beamsplitter 92 in the laser path, yet still not interfere with the remaining optics. As shown in FIGS. 11 and 12, beamsplitter 94 is mounted to a bracket 140 which includes a guide rail 142 extending along its rear surface. The rail 142 is coupled to and slides along a track 144 by means of linear bearings 146; these are preferably ball bearings set within aligned V-grooves in the rail and track. Track 144 in turn is mounted upon a rotatable pedestal 148 for beamsplitter 94, the rotational control over which has previously been described.

This arrangement constrains beamsplitter bracket 140 to move in only one linear direction, which is generally perpendicular to the beam 32d between beamsplitters 92 and 94. An arm 150 extends from rotational platform 20 to an opening 152 in beamsplitter bracket 140. As the rotational platform 20 rotates in one direction or the other, beamsplitter 92 will be moved to positions 92a and 92b, indicated by dashed lines in FIG. 11. This involves a movement having both X and Y components, with the X direction assumed for example to be horizontal and the Y direction vertical in FIG. 11. The rotation of platform 20 will produce a corresponding movement of arm 150, which pushes against bracket 140 within its slot and causes the bracket to move in the assumed Y direction. This in turn moves beamsplitter 94 to the positions 94a and 94b indicated in dashed lines. Beamsplitter 94 is prevented from moving in the X direction, movements of arm 150 in the X direction being accommodated by the arm simply moving into or out of slot 152. The net result in that beamsplitter 94 moves along with beamsplitter 92 perpendicular to the laser beam, thus keeping the beam directed onto beamsplitter 92.

Figure 4:
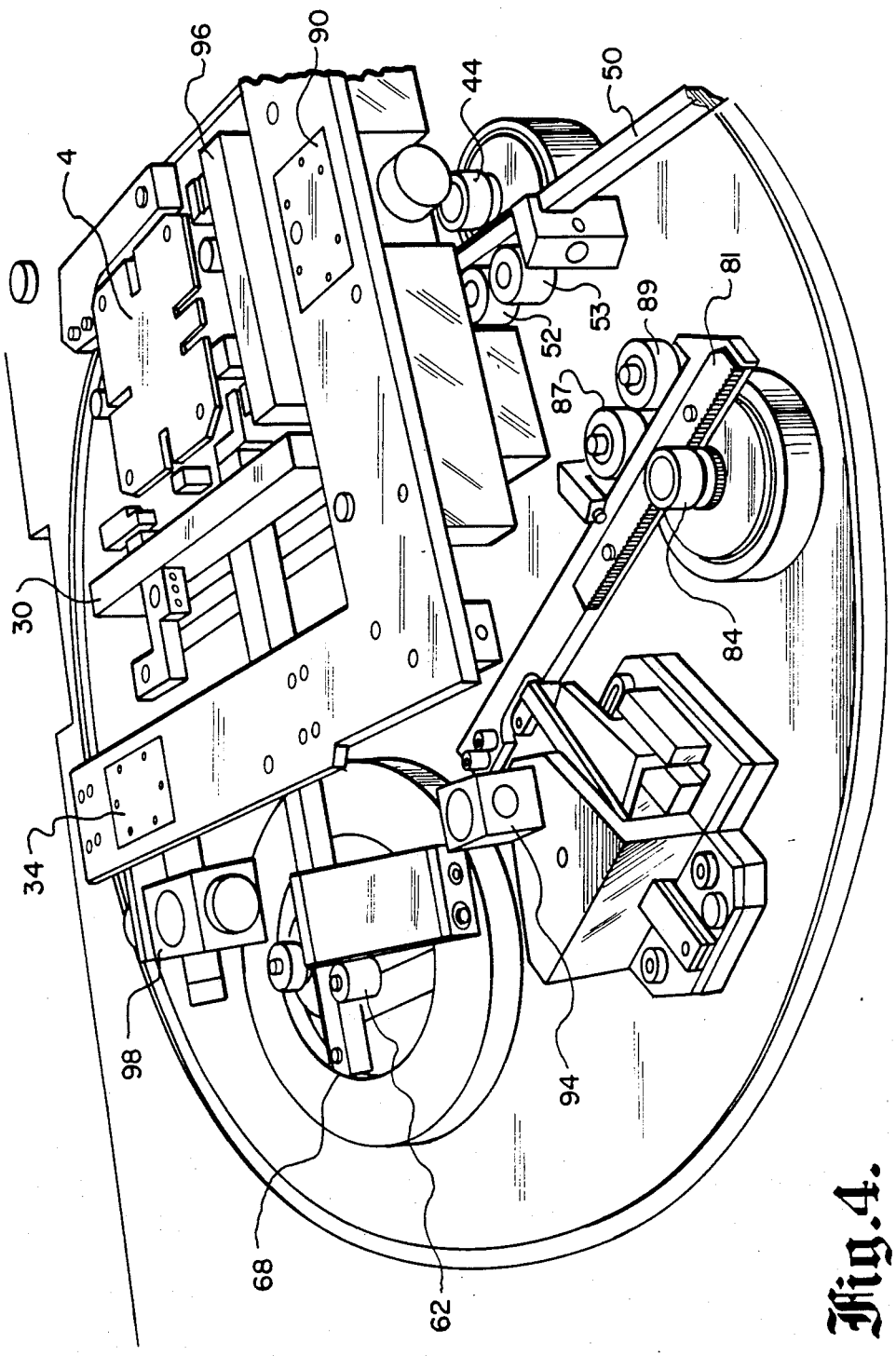
FIG. 4 is a perspective view of the present invention.
Figure 5:
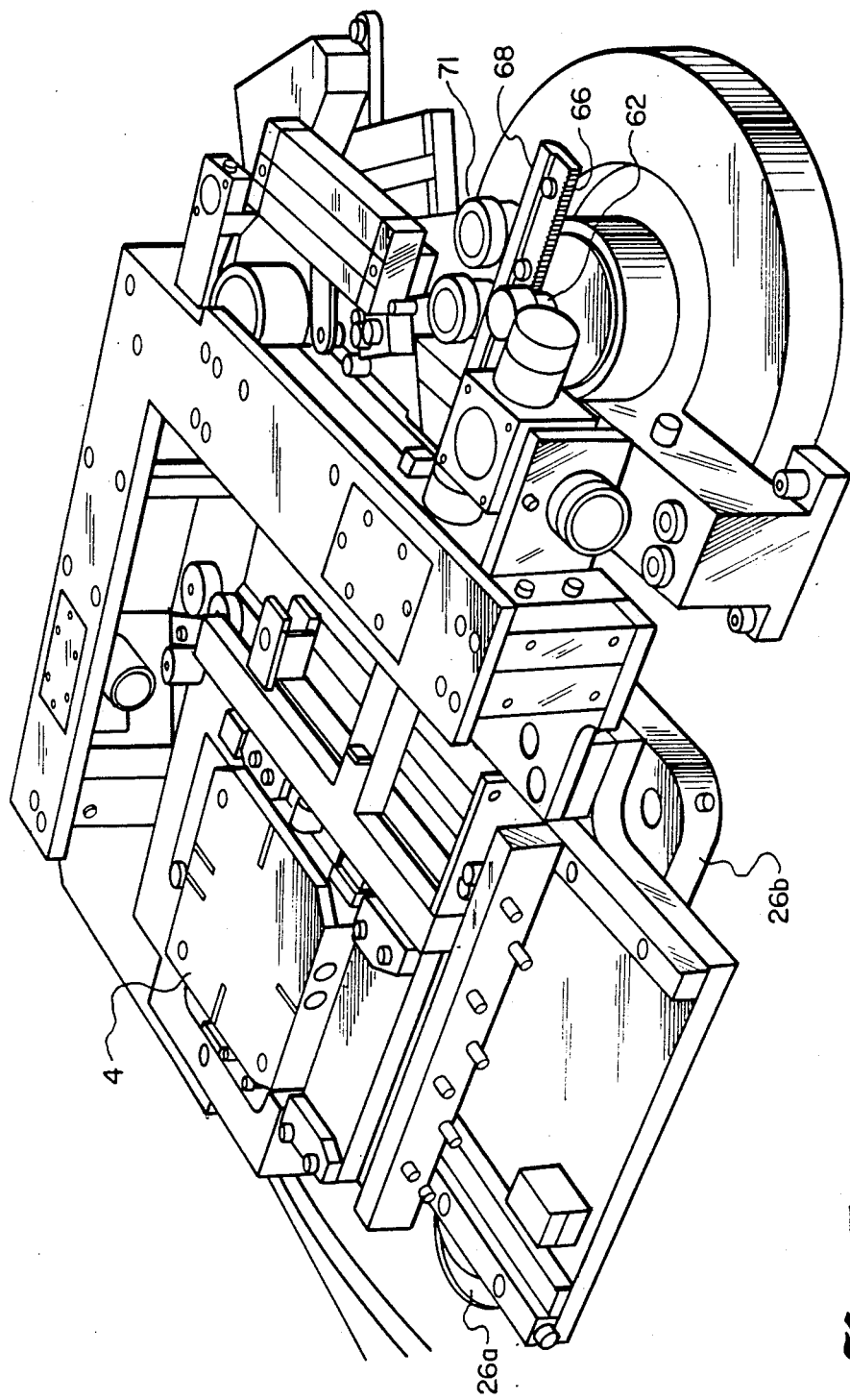
FIG. 5 is a perspective view of the present invention rotated through an angle of approximately 90° with respect to the view shown in FIG. 4.
Figure 6:
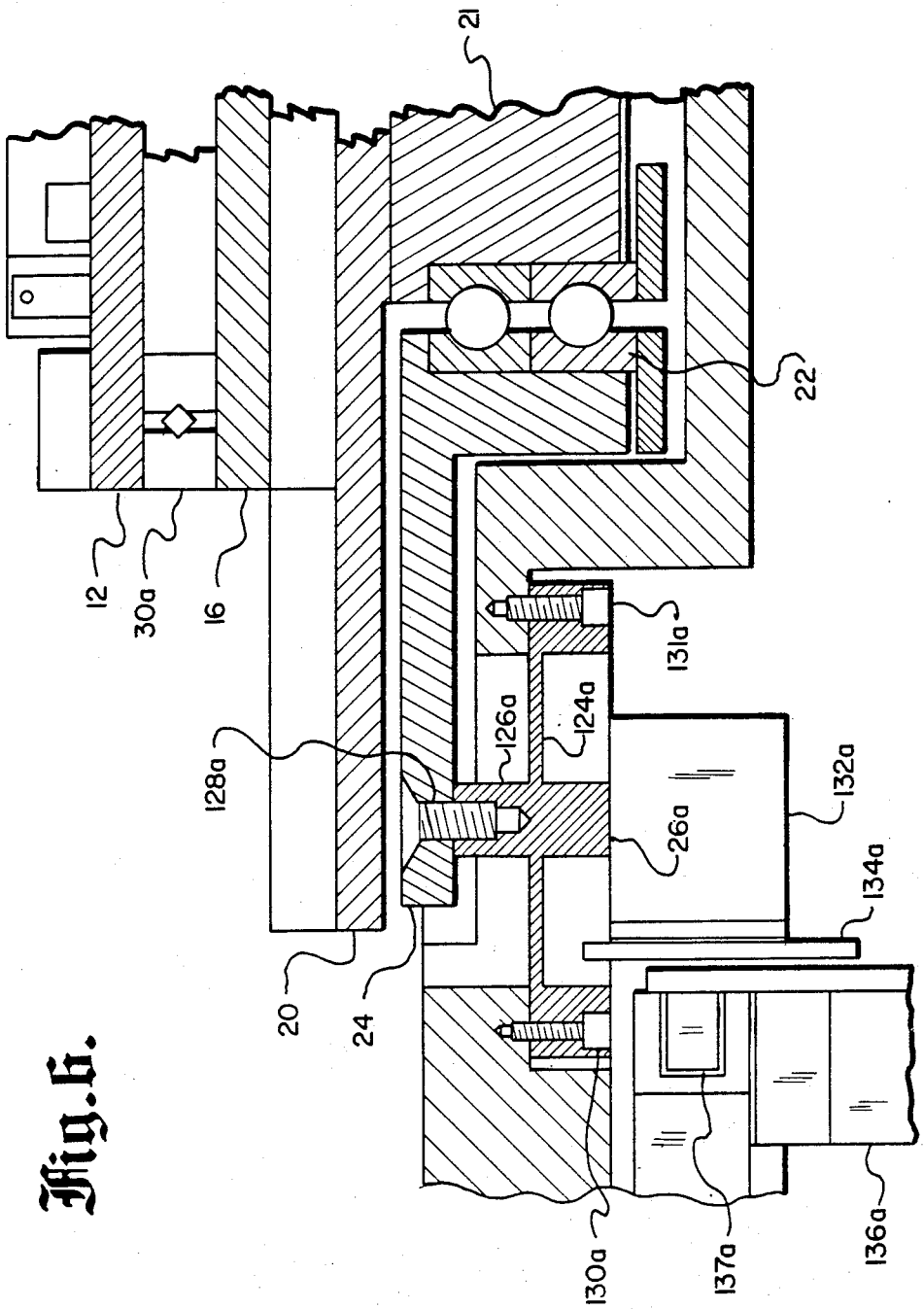
FIG. 6 is a sectional view of showing one of the Z-positioning drives as well as part of the θ rotation bearings.

FIG. 5 gives a view of the apparatus of the present invention that is shifted some 90° with respect to the view given by FIG. 4. Two of the three flexible mounts 26a,26b,26c are shown. FIG. 6 is a partial sectional view showing some of the details of the flexible mount 26a as well as part of the rotation bearing 60. The flexible mount 26a comprises a flexible circular metal diaphragm 124a with a center hub 126a drilled and tapped to receive a mounting screw 128a which attaches the flexible 26a to the intermediate platform 24. Peripheral mounting screws 130a,131a connect the flexible mount 26a to the base 28. A cam 132a, coupled through reduction gearing 134a to a motor 136a raises or lowers the center hub 126a according to which part of its rotation cycle is reached. An encoder 137a senses the position of cam 132a and transmits positional information to computer electronic control 10. The spring constant associated with one of the flexible mounts 26 is typically 50,000 pounds per inch, so that the hub 126 will undergo a deflection of roughly 0.010 inch for an applied force of 500 pounds. The drive motors 136a,136b,136c can be a Pittman model GM 9413-2. The encoders 137a,137b,137c can all be a Teledyne Gurley rotary encoder model 8211. Since there are three flexible mounts 26a,26b,26c which are coupled to independent Z drive motors 136a,136b,136c, the tilt of the X-Y stage plate 20 with respect to the horizontal plane can be changed in addition to changing the Z position.

From studying the various figures it can be appreciated that in using the positioning apparatus of the present invention, rotation of the semiconductor wafer always occurs about the same axis, which coincides with the center of the beam cross section, independent of the X or Y positions of the stage. It should be noted also that the support points for the vertically adjustable flexible mounts are located as nearly as possible in the planes of the X and Y drives, in order that reaction forces resulting from X and Y accelerations will have minimal impact on Z.

The present invention has been described in detail with reference to a particular preferred embodiment, but persons possessing ordinary skill in the art to which this invention pertains will appreciate that various modifications may be made without departing from the spirit and scope of the invention.

What is claimed is:

1. An X-Y-θ-Z positioning apparatus for positioning an semiconductor wafer during processing, comprising:
    an upper translational plate for supporting a semiconductor wafer during processing,
    a lower translational plate supporting the upper plate,
    a rotatable platform supporting the lower plate,
    a first set of bearings between the upper and lower plates enabling translation of the upper plate along a first axis with respect to the lower plate,
    a second set of bearings between the lower plate and rotatable platform enabling translation of the lower plate along a second axis with respect to the rotatable stage which is orthogonal to said first axis,
    means for moving the upper plate along said first axis by controlled amounts,
    means for moving the lower plate together with the upper plate along said second axis by controlled amounts,
    means for rotating the platform together with the upper and lower plates by controlled amounts, and
    means for elevating and tilting the platform together with the upper and lower plates by controlled amounts.

2. The positioning apparatus of claim 1, further comprising a pair of interferometers mounted to and moving with said rotatable platform, and a pair of mirrors mounted to and moving with said upper plate, one interferometer cooperating with one of the mirrors and the other interferometer cooperating with the other mirror to determine the position of said upper plate with respect to said rotatable platform.

3. The positioning apparatus of claim 2, wherein said means for moving the upper and lower plates are controlled by said interferometers.

4. The positioning apparatus of claim 2, further comprising a first beamsplitter mounted to and moving with said rotatable platform for splitting an input beam between said interferometers, a second beamsplitter positioned off said rotatable platform for receiving and directing an input beam to said first beamsplitter and means for rotating said second beamsplitter in coordination with said rotatable platform through half the angular rotation of said rotatable platform.

5. The positioning apparatus of claim 4, further comprising a moveable mounting bracket for said second beamsplitter, and a beamsplitter drive means mounted to and moving with said rotatable platform, said beamsplitter drive means engaging said moveable mounting bracket for the second beamsplitter to move the second beamsplitter along an axis which is generally perpendicular to the direction of the input beam to said first beamsplitter, said beamsplitter drive means tracking movements of the first beamsplitter parallel to said axis, thereby keeping the input beam from said second beamsplitter directed onto said first beamsplitter.

6. The positioning apparatus of claim 5, said mounting bracket for the second beamsplitter including an opening, said beamsplitter drive means comprising an arm which extends into said opening, said arm and opening being oriented so that arm movements along said axis drive said bracket, and arm movements perpendicular to said axis are accommodated by movement of the arm into or out of said bracket opening.

7. The positioning apparatus of claim 1, said means for moving the upper and lower plates comprising respective drive motors, and means coupling said drive motors to their respective plates, each of said coupling means including a positive traction means retaining the coupling means in engagement with its respective drive motor over the range of positions for its respective plate.

8. The positioning apparatus of claim 7, each of said coupling means comprising a pinion gear rotated by its respective drive motor, a drive rod extending from the pinion gear and coupled to a respective plate, said drive rod including a rack gear, engaging said pinion gear and stiffly resilient pressure means bearing against said drive rod to maintain an engagement between said rack and pinion gears.

9. The positioning apparatus of claim 8, each of said drive rods being pivotally coupled to its respective plate.

10. The positioning apparatus of claim 8, the pressure means for each drive rod comprising a pair of pressure rollers bearing against the drive rod on the opposite side thereof from the pinion gear, one roller being positioned forward and the other roller being positioned rearward of the pinion gear in the direction of drive rod movement.

11. The positioning apparatus of claim 9, said drive rods including respective narrowed sections which enable transverse flexing of the rods.

12. The positioning apparatus of claim 1, said means for elevating and tilting the rotatable platform comprising a rotor supporting and tilting with the platform, a stator providing a rotational base and an elevation and tilt control for the rotor, and means for applying independent vertical adjustments to a plurality of locations on the stator, the pattern of vertical adjustments controlling the elevation and tilt of the stator and thereby of the rotor, rotatable platform and upper and lower plates.

13. The positioning apparatus of claim 12, said stator including a flange which extends outward beyond said rotor, rotatable platform and upper and lower plates, said means for applying vertical adjustments engaging the stator along said flange.

14. The positioning apparatus of claim 12, further comprising:
   a base,
   a laser mounted on said base,
   a first interferometer mounted on said rotor,
   a second interferometer mounted on said rotor,
   a rotational interferometer mounted on said base,
   first and second beamsplitters, said first beamsplitter being rotatably mounted and dividing a beam from said laser into a first part along a first path to said rotational interferometer and a second part along a second path to said second beamsplitter, and said second beamsplitter further dividing said second part of said laser beam into a third part along a third path to said first interferometer and a fourth part along a fourth path to said second interferometer,
   half-angle coupling means causing said first beamsplitter to rotate through half the angle through which said rotor rotates,
   a retroreflector mounted on said rotor, disposed behind said rotational interferometer on a side opposite the beam entrance side of said interferometer,
   a first laser mirror mounted on said upper translational plate facing said first interferometer,
   a second laser mirror mounted on said upper translational plate facing said second interferometer,
   a first laser receiver receiving that part of said laser beam incident upon said first interferometer after reflection from said first laser mirror,
   a second laser receiver receiving that part of said laser beam incident upon said second interferometer after reflection from said second laser mirror, and
   a third laser receiver mounted on said base to receive that part of said laser beam incident upon said rotational interferometer after reflection from said retroreflector.

15. The positioning apparatus of claim 14 wherein said first, second, and rotational interferometers control said first means for moving the plates along said first and second axes and said platform rotating means, respectively, to position the upper plate at a desired position.

16. The positioning apparatus of claim 14, wherein said half-angle coupling means comprises:
   a first linkage arm, one end of which is rigidly coupled to said first beamsplitter,
   a first pin mounted on said base,
   a second linkage arm, one end of which is pivotally attached to the other end of said first linkage arm, and which has a slot through it to accept said first pin,
   a second pin mounted on said base,
   a third linkage arm pivotally attached to the other end of said second linkage arm and having a hole through it in which said second pin fits, and
   a fourth linkage arm pivotally connected at one end to the other end of said third linkage arm, and pivotally connected at its other end to said rotor, wherein the dimensions of the four linkage arms and their points of connection and the positions of said slot and said hole are chosen so that the first beamsplitter rotates through only half the angle through which the rotor rotates.

17. The positioning apparatus of claim 12, further comprising a base, wherein said elevating and tilting means comprise:
   a plurality of flexible mounts supporting said rotatable platform, each flexible mount independently allowing vertical motion of said platform by flexure of a flexible part of said mount, and
   a plurality of vertical drive means attached to said base for flexing said flexible parts of said mounts.

18. The positioning apparatus of claim 17, in which each said flexible mount comprises:
   a flexible diaphragm,
   a center hub on said diaphragm supporting a portion of said rotatable platform,
   an outer mounting flange extending around the periphery of said diaphragm,
   first mounting means mounting said flange to said base, and
   second mounting means mounting said center hub to said stator.

19. The positioning apparatus of claim 18, in which each vertical drive means comprises:
   a drive motor having an outer shaft,
   a set of reduction gears driven by said shaft, and
   a cam driven by said gears, the cam contacting said center hub to move it vertically when the cam is rotated.

20. An X-Y-$\theta$Z positioning apparatus for positioning a semiconductor wafer during processing, comprising:
   a support member for a semiconductor wafer,
   means for moving said support member in an X-Y plane,
   means for rotating said support member,
   means for elevating and tilting the support member,
   a pair of mirrors on said support member,
   a pair of interferometers, and
   means mounting said interferometers to track rotating, elevating and tilting movements of said support member independent of X-Y movements thereof, said interferometers cooperating with said members to determine the X-Y position of said support member.

21. The positioning apparatus of claim 20, wherein said means for moving the support member in an X-Y plane are controlled by said interferometers.

22. The positioning apparatus of claim 20, said means for rotating said support member including a rotatable platform supporting said support member, said interferometers being mounted to and rotating with said rotatable platform.

23. The positioning apparatus of claim 22, further comprising a first beamsplitter mounted to and moving with said rotatable platform for splitting an input beam between said interferometers, a second beamsplitter positioned off said rotatable platform for receiving and directing an input beam to said first beamsplitter, and means for rotating said second beamsplitter in coordination with said rotatable platform through half the angular rotation of said rotatable platform.

24. The positioning apparatus of claim 23, further comprising a moveable mounting bracket for said second beamsplitter, and a beamsplitter drive means mounted on and moving with said rotatable platform, said beamsplitter drive means engaging said moveable mounting bracket for the second beamsplitter to move the second beamsplitter along an axis which is generally perpendicular to the direction of the input beam to said first beamsplitter, said beamsplitter drive means tracking movements of the first beamsplitter parallel to said axis, thereby keeping the input beam from said second beamsplitter directed onto said first beamsplitter.

25. The positioning apparatus of claim 24, said mounting bracket for the second beamsplitter including an opening, said beamsplitter drive means comprising an arm which extends into said opening, said arm and opening being oriented so that arm movements along said axis drive said bracket, and arm movements perpendicular to said axis are accommodated by movement of the arm into or out of said bracket opening.

26. An X-Y-Θ-Z positioning apparatus for positioning a semiconductor wafer during processing, comprising:
a support member for a semiconductor wafer,
means for moving said support member in an X-Y plane,
means for rotating said support member,
means for elevating and tilting the support member,
a drive motor, and
means coupling said drive motor to said support member, said coupling means including a positive traction means retaining it in engagement with the drive motor over the range of positions for said support member.

27. The positioning apparatus of claim 26, said coupling means comprising a pinion gear rotated by said drive motor, a drive rod extending from the pinion gear and coupled to said support member, said drive rod including a rack gear section, and stiffly resilient pressure means bearing against said drive rod to maintain an engagement between said rack and pinion gears.

28. The positioning apparatus of claim 27, said drive rod being pivotally coupled to said support member.

29. The positioning apparatus of claim 28, said pressure means comprising a pair of pressure rollers bearing against the drive rod on the opposite side thereof from the pinion gear, one roller being positioned forward and the other roller being positioned rearward of the pinion gear in the direction of drive rod movement.

30. The positioning apparatus of claim 29, said drive rod including a narrowed section enabling transverse flexing of said rod.

* * * * *

UNITED STATES PATENT AND TRADEMARK OFFICE
CERTIFICATE OF CORRECTION

PATENT NO. : 4,891,526
DATED : January 2, 1990
INVENTOR(S) : JOHN W. REEDS

It is certified that error appears in the above-identified patent and that said Letters Patent is hereby corrected as shown below:

IN CLAIM 19, line 3, column 12, delete "outer" and insert therefor --output--.

Signed and Sealed this

Fifteenth Day of September, 1992

*Attest:*

DOUGLAS B. COMER

*Attesting Officer*    Acting Commissioner of Patents and Trademarks